United States Patent
Li et al.

(10) Patent No.: US 8,031,750 B2
(45) Date of Patent: Oct. 4, 2011

(54) LIGHT TRANSMITTER AND AUTOMATIC POWER CONTROL CIRCUIT THEREOF

(75) Inventors: Day-Uei Li, Hsinchu (TW); Hsin-Chao Chen, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/869,755

(22) Filed: Aug. 27, 2010

(65) Prior Publication Data
US 2010/0322274 A1   Dec. 23, 2010

Related U.S. Application Data

(62) Division of application No. 12/060,272, filed on Apr. 1, 2008, now Pat. No. 7,813,392.

(30) Foreign Application Priority Data

Nov. 15, 2007 (TW) .............................. 96143272 A

(51) Int. Cl.
*H01S 3/13* (2006.01)
(52) U.S. Cl. .............................. 372/29.021; 372/29.014
(58) Field of Classification Search ............. 372/29.011, 372/29.014, 29.021, 38.01, 38.02
See application file for complete search history.

*Primary Examiner* — Armando Rodriguez
(74) *Attorney, Agent, or Firm* — Jianq Chyun IP Office

(57) ABSTRACT

A light transmitter and an auto-control circuit thereof are provided. The circuit includes a driving module and a feedback module. The driving module is coupled to the feedback module and a load. The driving module provides a driving current for driving the load. The feedback module provides a bias signal to the driving module according to the change of the temperature, for adjusting the driving current and stabilizing an output power.

19 Claims, 12 Drawing Sheets

LIGHT TRANSMITTER AND AUTOMATIC POWER CONTROL CIRCUIT THEREOF

CROSS-REFERENCE TO RELATED APPLICATION

This application is a divisional application of a prior application Ser. No. 12/060,272, filed on Apr. 1, 2008, now allowed, which claims priority benefit of a Taiwan application serial no. 96143272, filed on Nov. 15, 2007. The entirety of each of the above-mentioned patent applications is hereby incorporated by reference herein and made a part of this specification.

BACKGROUND OF THE INVENTION

1. Field of the Invention

The present invention generally relates to a light transmitter, in particular, to a transmitter and an automatic power control (APC) circuit thereof.

2. Description of Related Art

With the increase of people's demands and the diversification of consumptive electronic products, some short-distance transmission electronic devices, such as infrared ray remote controls, toy car remote controls, and access control systems, have gradually become indispensable tools in people's life. Besides, relative applications can be found in digital storage devices, for example, laser diodes applied in optical pickup heads of digital versatile disk (DVD) drives.

The characteristic curve of the above laser diode may change with the rising temperature during the usage. As shown in FIG. 1, the first characteristic curve 101 is the characteristic curve of the laser diode when working at a normal temperature, and the second characteristic curve 102 is the characteristic curve after the temperature rises. In FIG. 1, the horizontal axis is the current input, and the longitudinal axis is the power output. The turning points of the first and second curves represent a turn-on point of the laser diode at the specific working temperature. Referring to FIG. 1, a first bias current IB1 is provided at a normal temperature, and a corresponding output power is obtained as a first output power P1. Then, a first modulation current IM1 is provided and a corresponding first swing output power 103 may be obtained. At this time, if the temperature rises, the characteristic curve of the laser diode changes into the second curve 102, so the originally provided first bias current IB1 is unable to turn on the laser diode. Even if the first bias current IB1 is raised to a second bias current IB2 to turn on the laser transistor, in order to achieve the swing output power the same as that obtained at the normal temperature, a second modulation current IM2 greater than the first modulation current IM1 must be provided.

In view of the above, a fixed driving current is unable to control the power output of the laser diode, so a conventional automatic power control (APC) circuit is provided. FIG. 2 is a conventional double-loop APC circuit, in which a laser diode module 210 includes a group of laser diodes LD for generating a light signal, and a photo diode serving as a photo detector PD. A cathode of the laser diodes LD is coupled to a bias current source 203 through a ferrite bead 204. A driver 201 receives a pair of differential input signals VIN1 and VIN2, and outputs a modulation signal to the cathode of the laser diodes LD. The amplitude of the modulation signal is determined by a modulation current source 202. The operating mode of the power control circuit is described as follows. The photo detector PD detects a current of the laser diodes LD, and the current is converted into a voltage signal by a trans-impedance amplifier (TIA) 205. Then, the converted voltage signal is transmitted to a valley detector 208 and a peak detector 209 respectively, so as to detect a peak value and a valley value of the current, and transmit the peak value and the valley value respectively to comparators 206, 207. The comparator 206 controls the bias current source 203 based on a result of comparison between the valley value and a first reference voltage VREFB1. The comparator 207 controls the modulation current source 202 based on a result of comparison between the peak value and a second reference voltage VREFM1. Thus, the output power may be automatically controlled by controlling the above two current sources. The first reference voltage VREFB1 and the second reference voltage VREFM1 are preset fixed voltages.

In the aforementioned conventional art, a photo detector PD is used as a detecting element. Thus, if the speed of light communication is faster, a high-speed photo detector PD is needed, which may greatly increase the cost.

SUMMARY OF THE INVENTION

Accordingly, in an embodiment of the present invention, an APC circuit is provided, which does not need a photo detector and thus reduces the cost. Moreover, a feedback module adjusts a bias signal according to a temperature, so as to compensate the temperature effect.

In an embodiment of the present invention, a light transmitter includes a laser diode and an APC circuit thereof, in which the output power and extinction ratio of the transmitter are stabilized by a control circuit.

In an embodiment of the present invention, an APC circuit includes a driving module and a first feedback circuit. The driving module is used to provide a driving current to a first end of a load, and change the driving current according to an input signal. Besides, the driving module adjusts a mean value of the driving current according to a bias signal. An input end of the first feedback module is coupled to the first end of the load, and an output end of the first feedback module is coupled to the driving module, for providing the bias signal to the driving module according to the driving current. Besides, the first feedback module adjusts the bias signal according to a temperature.

In an embodiment of the present invention, a light transmitter includes a light emitter, a driving module, and a first feedback module. The driving module is used to provide a driving current to a first end of the light emitter, and change the driving current according to an input signal. Besides, the driving module adjusts a mean value of the driving current according to a bias signal. An input end of the first feedback module is coupled to the first end of the light emitter, and an output end of the first feedback module is coupled to the driving module, for providing the bias signal to the driving module according to the driving current. Besides, the first feedback module adjusts the bias signal according to a temperature.

In an embodiment of the present invention, an APC circuit includes a voltage buffer unit, an amplifier, a transistor, and a feedback module. An input end of the voltage buffer unit receives an input signal, and an output end of the voltage buffer unit provides an AC signal to a load. A first input end of the amplifier receives a reference voltage. A gate of the transistor is coupled to an output end of the amplifier, a first source/drain of the transistor is coupled to a first voltage, and a second source/drain of the transistor is coupled to the output end of the voltage buffer unit. The feedback module has an impedance and is coupled between the second source/drain of the transistor and a second input end of the amplifier, for providing a feedback signal to the amplifier.

In an embodiment of the present invention, a light transmitter includes a light emitter, a voltage buffer unit, an amplifier, a transistor, and a feedback module. An input end of the voltage buffer unit is used to receive an input signal, and an output end of the voltage buffer unit is used to provide an AC signal to the light emitter. A first input end of the amplifier receives a reference voltage. A gate of the transistor is coupled to an output end of the amplifier, a first source/drain of the transistor is coupled to a first voltage, and a second source/drain of the transistor is coupled to the output end of the voltage buffer unit. The feedback module has an impedance and is coupled between the second source/drain of the transistor and a second input end of the amplifier, for providing a feedback signal to the amplifier.

In an embodiment of the present invention, a loop control structure including thermistors automatically adjusts the characteristic curve of the light emitter according to the actual temperature of the light-emitting element. Thus, the output characteristic of the light emitter is controlled stable to provide stable output power and extinction ratio.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
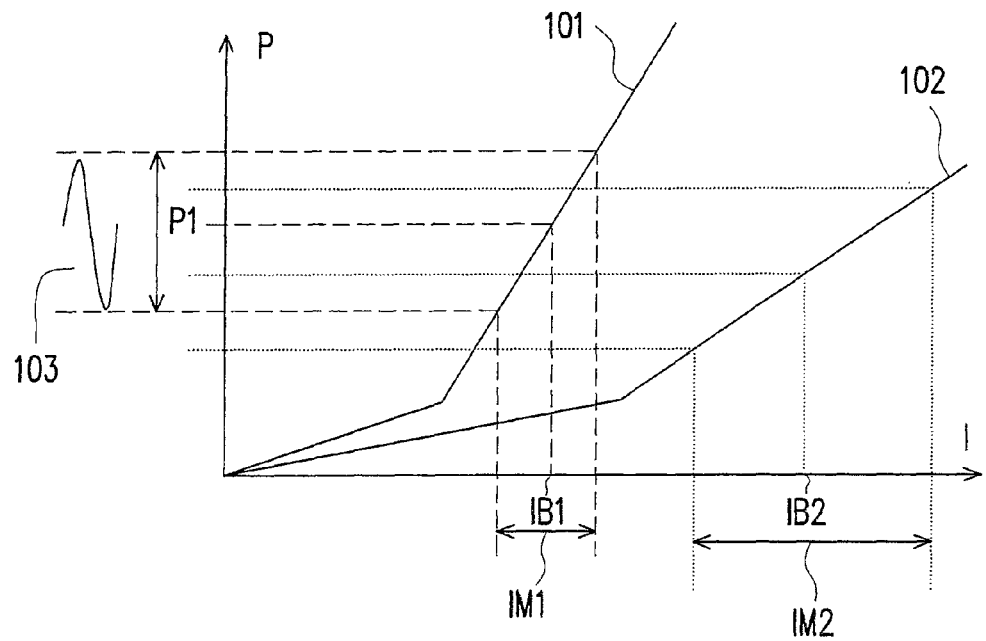
FIG. 1 is a characteristic curve diagram of a laser diode.
Figure 2:
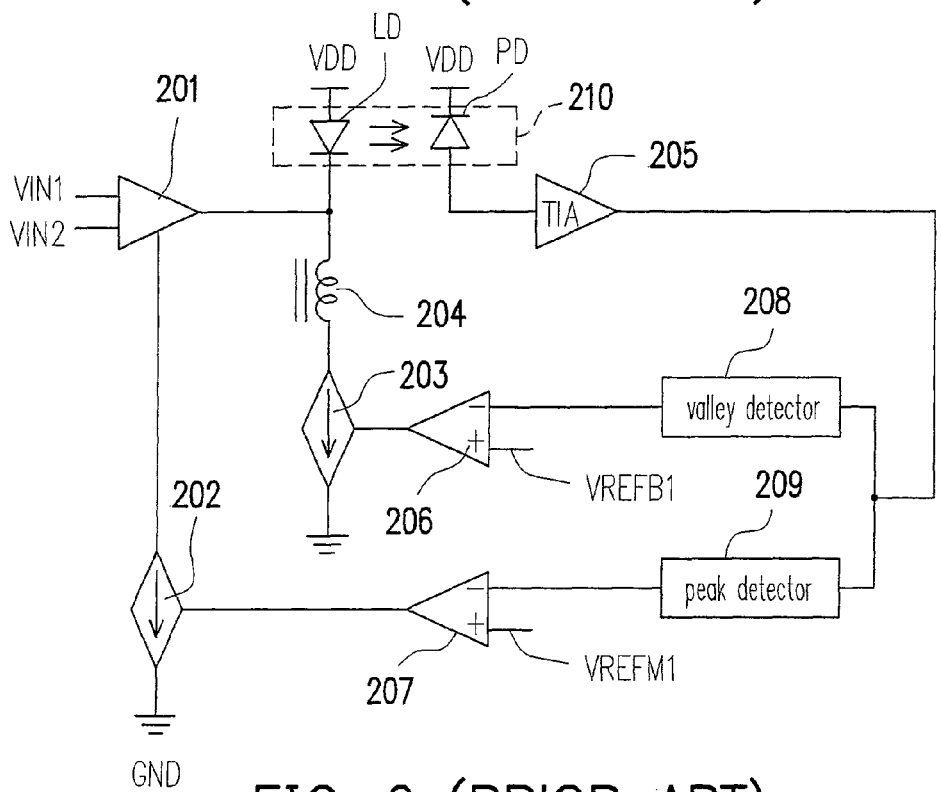
FIG. 2 shows a conventional APC circuit.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
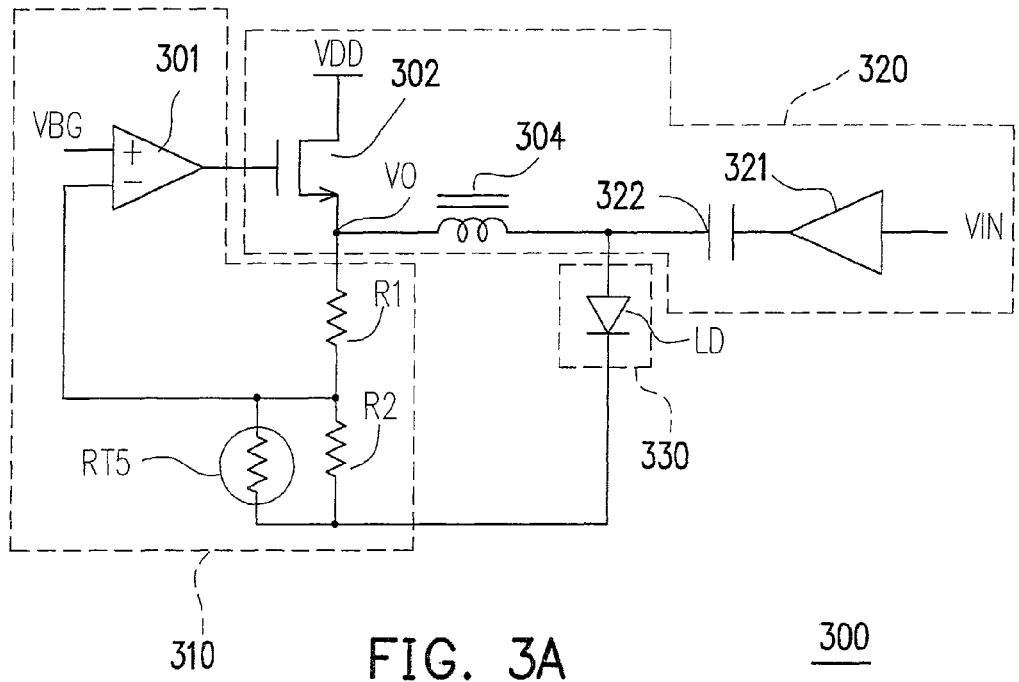
FIG. 3A shows an APC circuit according to a first embodiment of the present invention.

FIG. 3A shows a light transmitter according to a first embodiment of the present invention. The light transmitter 300 includes a light emitter 330 and an APC circuit. The APC circuit further includes a driving module 320, a ferrite bead 304, and a first feedback module 310. In this embodiment, the load (for example, the light emitter 330) of the APC circuit is a laser diode LD. In other embodiments, the light emitter 330 may be other elements/circuits (for example, an LED). The driving module 320 provides a driving current to an anode of the laser diode LD, and changes the driving current according to an input signal VIN. Besides, the driving module 320 adjusts a mean value of the driving current according to a bias signal output by the first feedback module 310. An input end of the first feedback module 310 is coupled to the anode of the laser diode LD through the ferrite bead 304, and an output end of the first feedback module 310 is coupled to the driving module 320. According to the driving current passing through the laser diode LD, the output end of the first feedback module 310 provides the bias signal to the driving module 320. In addition, the first feedback module 310 adjusts the bias signal according to a temperature.

Referring to FIG. 3A, the driving module 320 is coupled to the anode of the laser diode LD, and a cathode of the laser diode LD is grounded. The driving module 320 includes a voltage buffer unit and a transistor 302. The voltage buffer unit includes a driver 321 and a capacitor 322. Here, the driver 321 is, for example, a buffer. The input signal VIN is transmitted to a first end of the capacitor 322 through the driver 321. The capacitor 322 is capable of filtering a DC component from the input signal VIN, such that an AC component of the input signal VIN passes through the capacitor 322 to reach the anode of the laser diode LD.

The first feedback module 310 includes an amplifier 301, a fifth resistor R1, a sixth resistor R2, and a third thermistor RT5. A first input end (for example, a positive input end) of the amplifier 301 receives a reference voltage. Here, the reference voltage is a bandgap voltage VBG. An output end of the amplifier 301 is coupled to a gate of the transistor 302. A first source/drain of the transistor 302 is coupled to a first voltage (for example, a system power supply VDD), and a second source/drain of the transistor 302 is coupled to the anode of the laser diode LD through the ferrite bead 304. A first end of the fifth resistor R1 is coupled to the second source/drain of the transistor 302, and a second end of the fifth resistor R1 is coupled to a second input end (for example, a negative input end) of the amplifier 301. First ends of the third thermistor RT5 and the sixth resistor R2 are both coupled to the second end of the fifth resistor R1, and second ends of the third thermistor RT5 and the sixth resistor R2 are both coupled to a second voltage (for example, a system ground line GND). The ferrite bead 304 filters high frequency noises of the circuit, so as to prevent electromagnetic interference.

Referring to FIG. 3A, as the bandgap voltage VBG may not change with the system power supply VDD, a modulation voltage VO (here, a driving voltage of the laser diode LD) output by the transistor 302 is only related to a feedback impedance of the amplifier. Thus, the modulation voltage VO may be obtained from the following formula (in the formula, R2//RT5 is the resistance value of the resistor R2 and thermistor RT5 connected in parallel):

$$VO = VBG \frac{R1 + R2 // RT5}{R2 // RT5}$$

It may clearly seen from the above mathematical expression that, the modulation voltage VO changes with the variation of the resistance value of the third thermistor RT5 caused by the rise of the temperature. Accordingly, a span voltage $V_{LD}$ ($V_{LD}$=VDD−VO) of the laser diode LD changes to further adjust the characteristic curve of the laser diode LD.

Figure 3B:
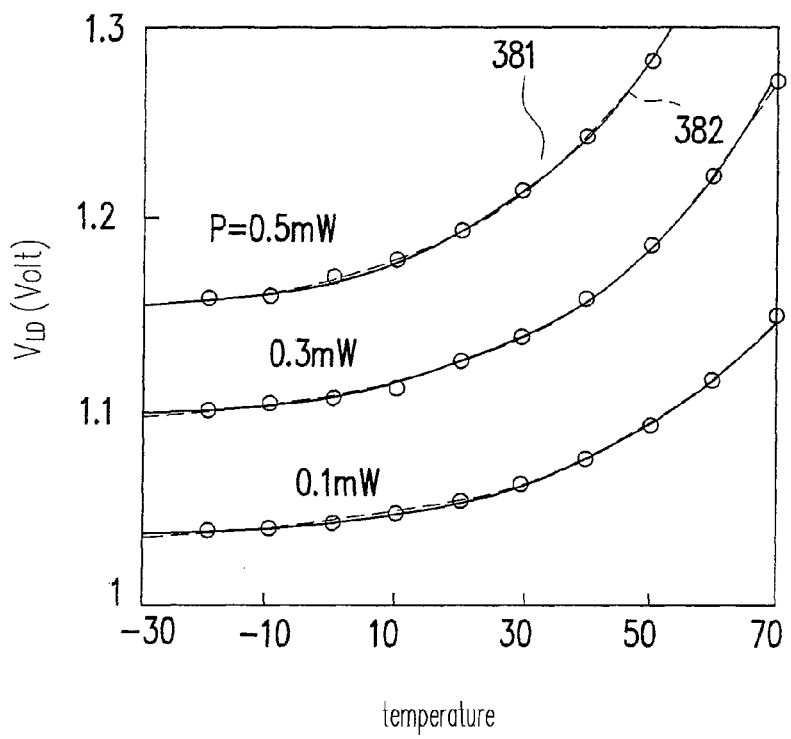
FIG. 3B is a characteristic curve diagram of a laser diode in FIG. 3A.

Referring to FIG. 3B, the relationship between the span voltage $V_{LD}$ of the laser diode LD and the temperature is shown. The first curve 381 (solid line) is the actual measured curve of the change of the span voltage $V_{LD}$ of the laser diode LD caused by a rising temperature in the situation that a specific power P is output to the laser diode LD. In addition, according to the formula of the modulation voltage VO, the simulated second curve 382 (dashed line) may be obtained by selecting appropriate resistors R1, R2 and thermistor RT5. Seen from FIG. 3B, the second curve 382 simulated by the light transmitter 300 is in perfect match with the actual measured first curve 381 of the laser diode LD.

Figure 4A:
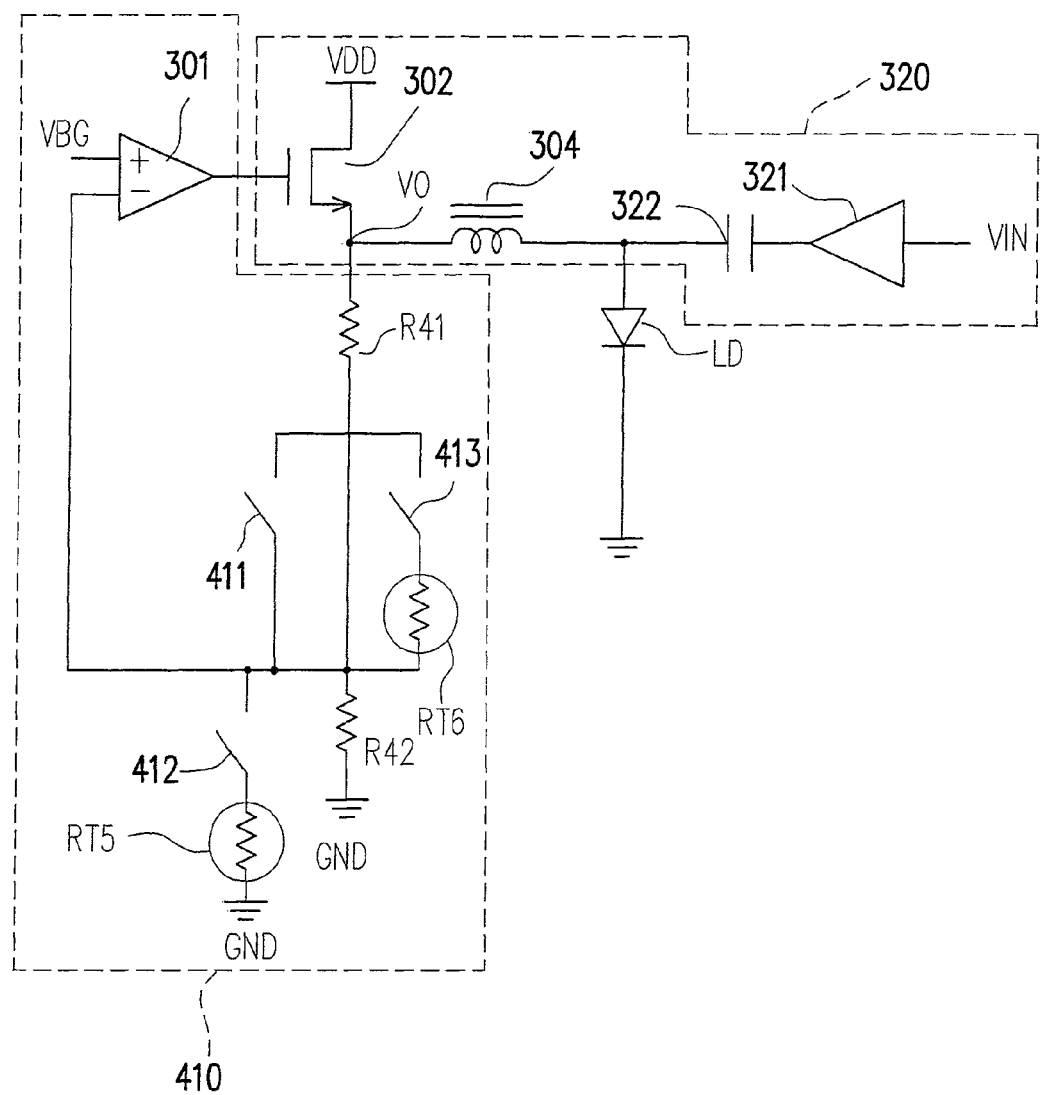
FIG. 4A shows an APC circuit according to a second embodiment of the present invention.
Figure 4B:
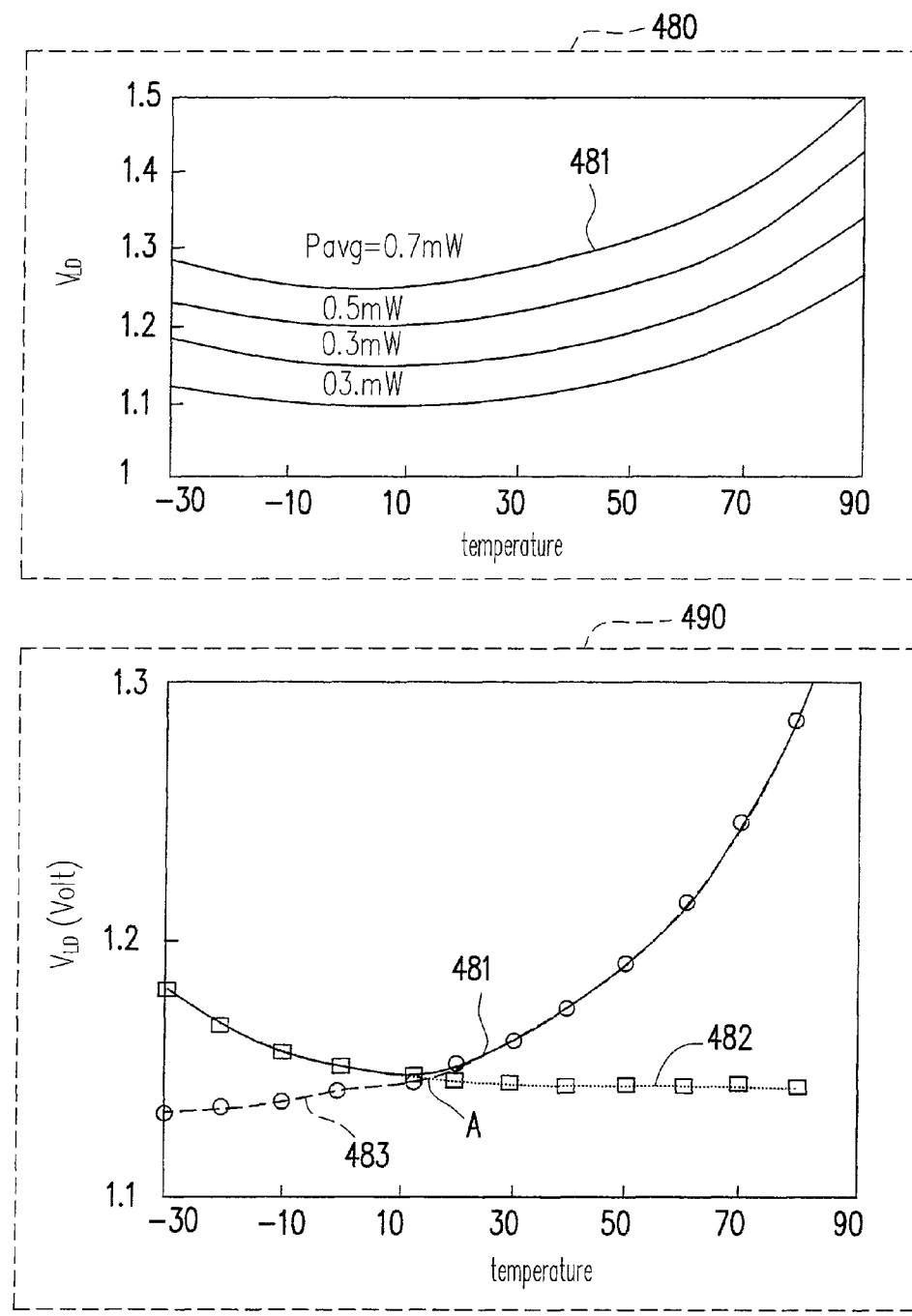
FIG. 4B is a characteristic curve diagram of a laser diode and a thermistor in FIG. 4A.

FIG. 4A shows a light transmitter according to a second embodiment of the present invention. The light transmitter 400 includes a light emitter and an APC circuit. The APC circuit further includes a driving module 320, a ferrite bead 304, and a first feedback module 410. In this embodiment, the load (for example, the light emitter) of the APC circuit is a laser diode LD. In other embodiments, the light emitter may be other elements/circuits (for example, an LED). This embodiment is applicable to some types of laser diodes LD with a characteristic curve 480 as shown in FIG. 4B. The characteristic curve of such types of laser diodes LD is a parabolic curve unlike a multiplier curve in the above embodiment. Therefore, the aforementioned embodiments are not applicable to the driving circuit of such type of laser diode LD.

Similar to the first embodiment, the architecture of this embodiment also includes a driving module 320 and a first feedback module 410. The driving module 320 has already been illustrated in detail in the first embodiment, so the details will not be described herein again. The first feedback module 410 includes an amplifier 301, a fifth resistor R41, a sixth resistor R42, a third thermistor RT5, a fourth thermistor RT6, a first switch 411, a second switch 412, and a third switch 413. A first end of the resistor R41 is coupled to the second source/drain of the transistor 302. A first end of the switch 411 is coupled to a second end of the resistor R41, and a second end of the switch 411 is coupled to the second input end (for example, a negative input end) of the amplifier 301. A first end of the resistor R42 is coupled to the second end of the switch 411, and a second end of the resistor R42 is coupled to a second voltage (for example, a ground line GND). A first end of the switch 412 is coupled to the second end of the first switch 411, and a second end of the switch 412 is coupled to a first end of the thermistor RT5. A second end of the thermistor RT5 is coupled to the ground line GND. A first end of the switch 413 is coupled to the second end of the resistor R41, and a second end of the switch 413 is coupled to a first end of the thermistor RT6. A second end of the thermistor RT6 is coupled to the first end of the resistor R42. In this embodiment, the first switch 411 and the second switch 412 are enabled in the same way, and the third switch 413 and the first switch 411 are enabled in opposite ways.

Referring to FIG. 4B, the sub-FIG. 480 is a characteristic curve diagram showing the relationship between the span voltage $V_{LD}$ of the laser diode LD in FIG. 4A and the temperature. The curve 481 shows the relationship between the span voltage $V_{LD}$ ($V_{LD}$=VDD−VO) of the laser diode LD and the temperature at an output power P. The sub-FIG. 490 shows the relationship between the span voltage $V_{LD}$ and the temperature of the circuits formed by different turn-on/off states of the switches.

Referring to FIGS. 4A and 4B together, when the switch 413 is enabled, and the switches 411, 412 are disabled, the output modulation voltage VO may be obtained by the following mathematical expression:

$$VO = VBG\frac{R41 + R42 + RT6}{R42}$$

A curve 482 may be obtained according to the above formula and the characteristics of the thermistors. If the switch 413 is disabled, and the switches 411, 412 are enabled, the modulation voltage VO may be obtained by the following mathematical expression (in the expression, R4//RT5 is the resistance value of the resistor R42 and thermistor RT5 connected in parallel):

$$VO = VBG\frac{R41 + R42 // RT5}{R42 // RT5}$$

A curve 483 may be obtained according to the above formula and the characteristics of the thermistors. In the figure, the junction A is an intersection point of the two curves.

From the two relation diagrams in FIG. 4B, it may be easily found that, the curve 482 is close to the curve 481 before the junction A, and the curve 483 is close to the curve 481 after the junction A. Thus, the laser diodes LD may be driven by the combination of the characteristics of the two curves.

In this embodiment, the whole operation is divided into two periods. During the first period, the first switch 411 and the second switch 412 are disabled, and the third switch 413 is enabled. During the second period, the first switch 411 and the second switch 412 are enabled, and the third switch 413 is disabled. The first period is before the junction A at low temperature. Once the temperature rises with the operating time and exceeds the junction A, the second period starts. Subsequently, if the temperature drops to below the junction A due to stand-by or sleep of the laser diode LD, the operation returns to the first period. In this manner, the characteristic curve of such a laser diode LD may be perfectly matched, thereby stabilizing the output power and extinction ratio.

Figure 5A:
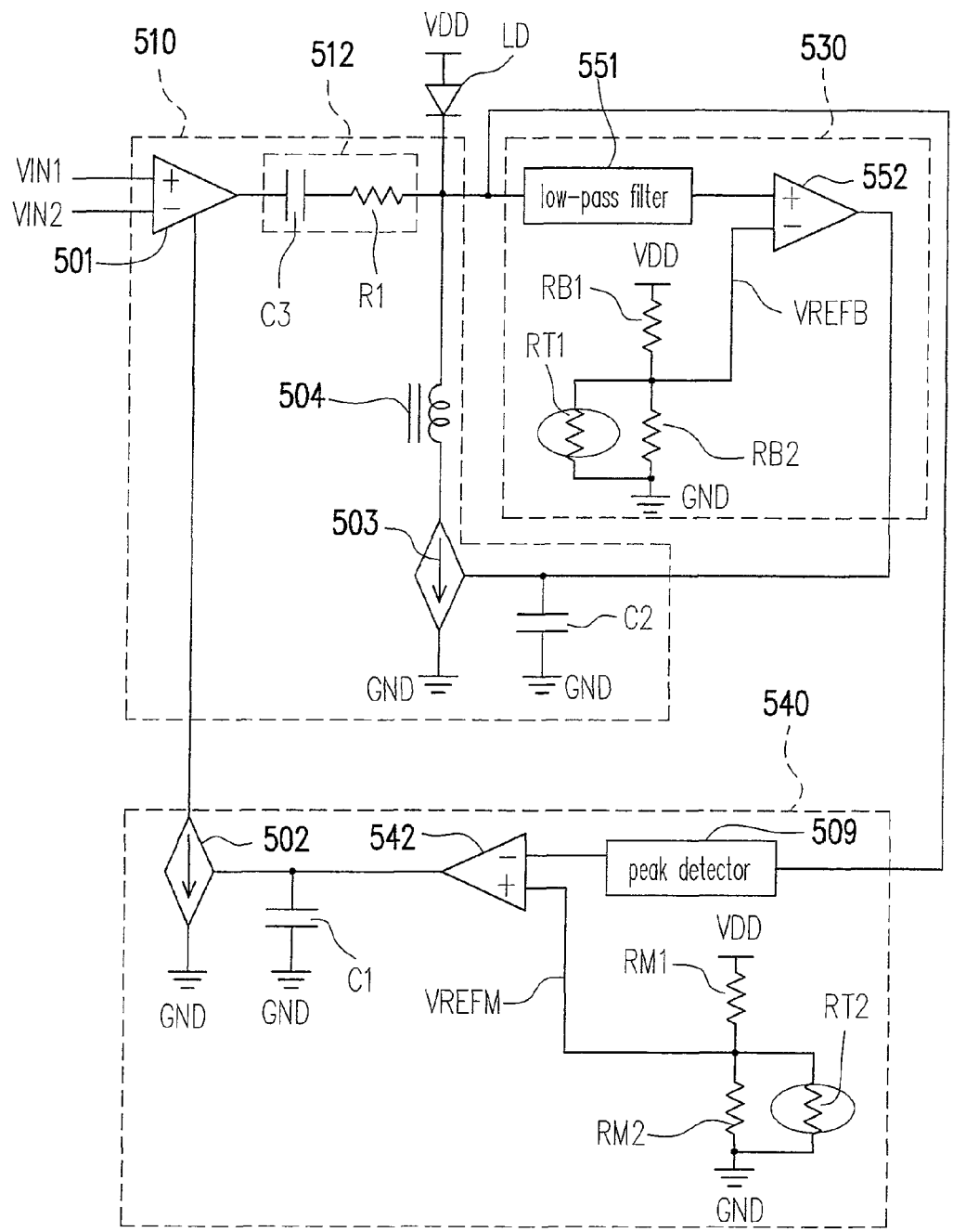
FIG. 5A shows an APC circuit according to a third embodiment of the present invention.

FIG. 5A shows a light transmitter according to a third embodiment of the present invention. The light transmitter 500 includes a light emitter and an APC circuit. The APC circuit further includes a driving module 510, a first feedback module 530, and a second feedback module 540. In this embodiment, the load (for example, the light emitter) of the APC circuit is a laser diode LD. In other embodiments, the light emitter may be other elements/circuits (for example, an LED).

The driving module 510 provides a driving current to a cathode of the laser diode LD, and changes the driving current according to an input signal VIN. In this embodiment, the input signal VIN is a pair of differential signals VIN1 and VIN2. An input end of the first feedback module 530 is coupled to the cathode of the laser diode LD, and an output end of the first feedback module 530 is coupled to the driving module 510. That is, according to the driving current passing through the laser diode LD, the output end of the first feedback module 530 provides a bias signal to the driving module 510. Besides, the driving module 510 adjusts a mean value of the driving current according to a bias signal output by the first feedback module 530. In addition, the first feedback module 530 adjusts the bias signal according to a temperature.

An input end of the second feedback module 540 is coupled to a cathode of the laser diode LD, and an output end of the second feedback module 540 is coupled to a bias control end of the driving module 510, so as to generate a modulation signal to control the driving module 510 to adjust the swing of the driving current. That is, according to the driving current passing through the laser diode LD, the output end of the second feedback module 540 provides a bias signal to the driving module 510. Therefore, the driving module 510 adjusts the swing of the driving current according to the modulation signal output by the second feedback module 540. In addition, the second feedback module 540 adjusts the modulation signal according to a temperature.

The driving module 510 further includes an AC coupling circuit 512, a driver 501, a bypass capacitor C2, and a bias current source 503. An input end of the driver 501 receives the pair of the differential signals VIN1 and VIN2, and an output end of the driver 501 is coupled to the cathode of the laser diode LD through the AC coupling circuit 512. The AC coupling circuit 512 filters a DC component from the output signal of the driver 501, and sends an AC component of the filtered output signal of the driver 501 to the cathode of the laser diode LD. A current end of the bias current source 503 is coupled to the cathode of the laser diode LD through a ferrite bead 504, so as to provide a bias current to the laser diode LD. The ferrite bead 504 is used to filter high frequency noises of the circuit, so as to prevent electromagnetic interference. The bypass capacitor C2 is coupled between a control end of the bias current source 503 and a ground line GND.

Referring to FIG. 5A again, the first feedback module 530 includes a low-pass filter 551, a comparator 552, a first resistor RB1, a second resistor RB2, and a first thermistor RT1. An input end of the low-pass filter 351 is coupled to the cathode of the laser diode LD, for calculating and outputting a mean value of the driving current of the laser diode LD to a first input end (for example, a positive input end) of the comparator 552. A second input end (for example, a negative input end) of the comparator 552 receives a first reference voltage VREFB, and the first reference voltage VREFB changes with the temperature. Moreover, an output end of the comparator 552 is coupled to a control end of the bias current source 503, for controlling the bias current source 503.

In this embodiment, the first reference voltage VREFB is generated by the first resistor RB1, the second resistor RB2, and the first thermistor RT1. A first end of the first resistor RB1 is coupled to a first voltage (for example, a system power supply VDD), and a second end of the first resistor RB1 is used to provide the first reference voltage VREFB. The second resistor RB2 is coupled between the second end of the first resistor RB1 and a second voltage (for example, a system ground line GND). The first thermistor RT1 is coupled between the second end of the first resistor RB1 and the system ground line GND, i.e., connected in parallel with the second resistor RB2. The first reference voltage VREFB is generated by a voltage division circuit constituted by the first resistor RB1, the second resistor RB2, and the first thermistor RT1, and is obtained by the following mathematical expression (in the expression, RB2//RT1 is the resistance value of the second resistor RB2 and first thermistor RT1 connected in parallel):

$$VREFB = VDD - \frac{VDD \cdot RB1}{RB1 + RB2 // RT1}$$

The first feedback circuit 530 adjusts the bias current source 503 to make an output signal of the low-pass filter 551 close to the first reference voltage VREFB, i.e., to make a mean value of the level at the cathode of the laser diode LD approximate to the first reference voltage VREFB.

The second feedback module 540 further includes a peak detector 509, a comparator 542, a third resistor RM1, a fourth resistor RM2, a thermistor RT2, a modulation current source 502, and a capacitor C1. An input end of the peak detector 509 is coupled to the cathode of the laser diode LD. The peak detector 509 detects a peak value of the driving current of the laser diode LD, and outputs the peak value of the driving current to a first input end (for example, a negative input end) of the comparator 542. A second input end (for example, a positive input end) of the comparator 542 receives a second reference voltage VREFM, and the second reference voltage VREFM changes with the temperature. An output end of the comparator 542 is coupled to a control end of the modulation current source 502. The bypass capacitor C1 is coupled between the control end of the modulation current source 502 and the ground line GND. A current end of the modulation current source 502 is coupled to the bias control end of the driving module 510, so as to generate the modulation signal to control the driving module 510 to adjust the swing of the driving current.

In this embodiment, the second reference voltage VREFM is generated by the third resistor RM1, the fourth resistor RM2, and the thermistor RT2. A first end of the third resistor RM1 is coupled to a first voltage (here, a system power supply VDD), and a second end of the third resistor RM1 provides a second reference voltage VREFM. The fourth resistor RM2 is coupled between a second end of the resistor RM1 and a second voltage (here, a ground line GND). The second thermistor RT2 is coupled between the second end of the third resistor RM1 and the system ground line GND, i.e., connected in parallel with the fourth resistor RM2. The second reference voltage VREFM is generated by a voltage division circuit constituted by the third resistor RM1, the fourth resistor RM2, and the second thermistor RT2, and is obtained by the following mathematical expression (in the expression, RM2//RT2 is the resistance value of the fourth resistor RM2 and second thermistor RT2 connected in parallel):

$$VREFM = VDD - \frac{VDD \cdot RM1}{RM1 + RM2 // RT2}$$

Similar to the first feedback circuit 530, the second feedback circuit 540 adjusts the modulation current source 502 to make an output signal of the peak detector 509 close to the second reference voltage VREFM, i.e., to make a maximum value (i.e., a peak value of the driving current) of the level at the cathode of the laser diode LD approximate to the second reference voltage VREFM.

Figure 5B:
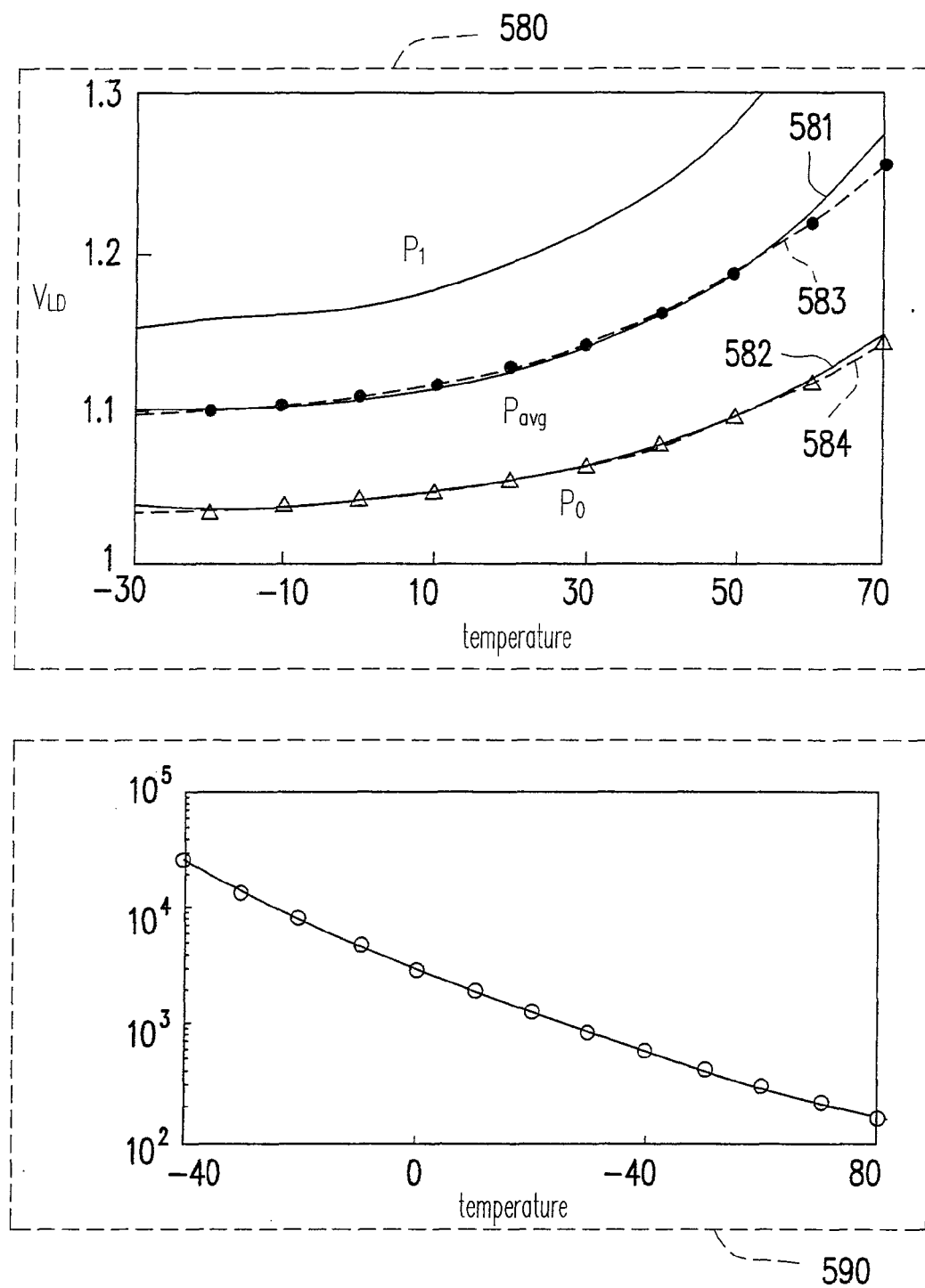
FIG. 5B is a characteristic curve diagram of a laser diode and a thermistor in FIG. 5A.

FIG. 5B is a curve diagram showing the relationship between the span voltage $V_{LD}$ of the laser diode LD in FIG. 5A and the temperature. The sub-FIG. 580 shows the relationship between the span voltage $V_{LD}$ of the laser diode LD and the temperature at a specific power P. The curve 581 (solid line) shows the relationship between the actual measured span voltage $V_{LD}$ of the laser diode LD and the temperature in the situation that a mean power $P_{AVG}$ of about 0.3 mW is output to the laser diode LD. The curve 582 (solid line) shows the relationship between the actual measured span voltage $V_{LD}$ of the laser diode LD and the temperature under the condition that a minimum power $P_O$ of about 0.1 mW is output to the laser diode LD. The sub-FIG. 590 shows the relationship between the resistance value of the thermistor and the temperature. According to the characteristic of the thermistor, a formula between the first reference voltage VREFB and the resistors and a formula between the second reference voltage VREFM and the resistors are obtained, thus obtaining a curve 583 (dashed line) and a curve 584 (dashed line). The curve 583 shows the relationship between the system power supply VDD minus the first reference voltage VREFB and the temperature. That is, in this embodiment, the curve 583 is a simulated curve showing the relationship between the span voltage $V_{LD}$ of the laser diode LD and the temperature when a mean power $P_{AVG}$ of about 0.3 mW is output to the laser diode LD. Similarly, the curve 584 shows the relationship between the system power supply VDD minus the second reference voltage VREFM and the temperature. That is, in this embodiment, the curve 584 is a simulated curve showing the relationship between the span voltage $V_{LD}$ of the laser diode LD and the temperature when a minimum power $P_0$ of about 0.1 mW is output to the laser diode LD.

A resistor combination that makes the curve 581 match the curve 583 and the curve 582 match the curve 584 may be obtained by adjusting the resistance values of the first resistor RB1, the second resistor RB2, the third resistor RM1, and the fourth resistor RM2, or by selecting a different first thermistor RT1 and second thermistor RT2. The selected resistor combination may achieve the purpose of achieving a fixed output power of the laser in the embodiment so as to further stabilize the output power and extinction ratio.

Figure 6A:
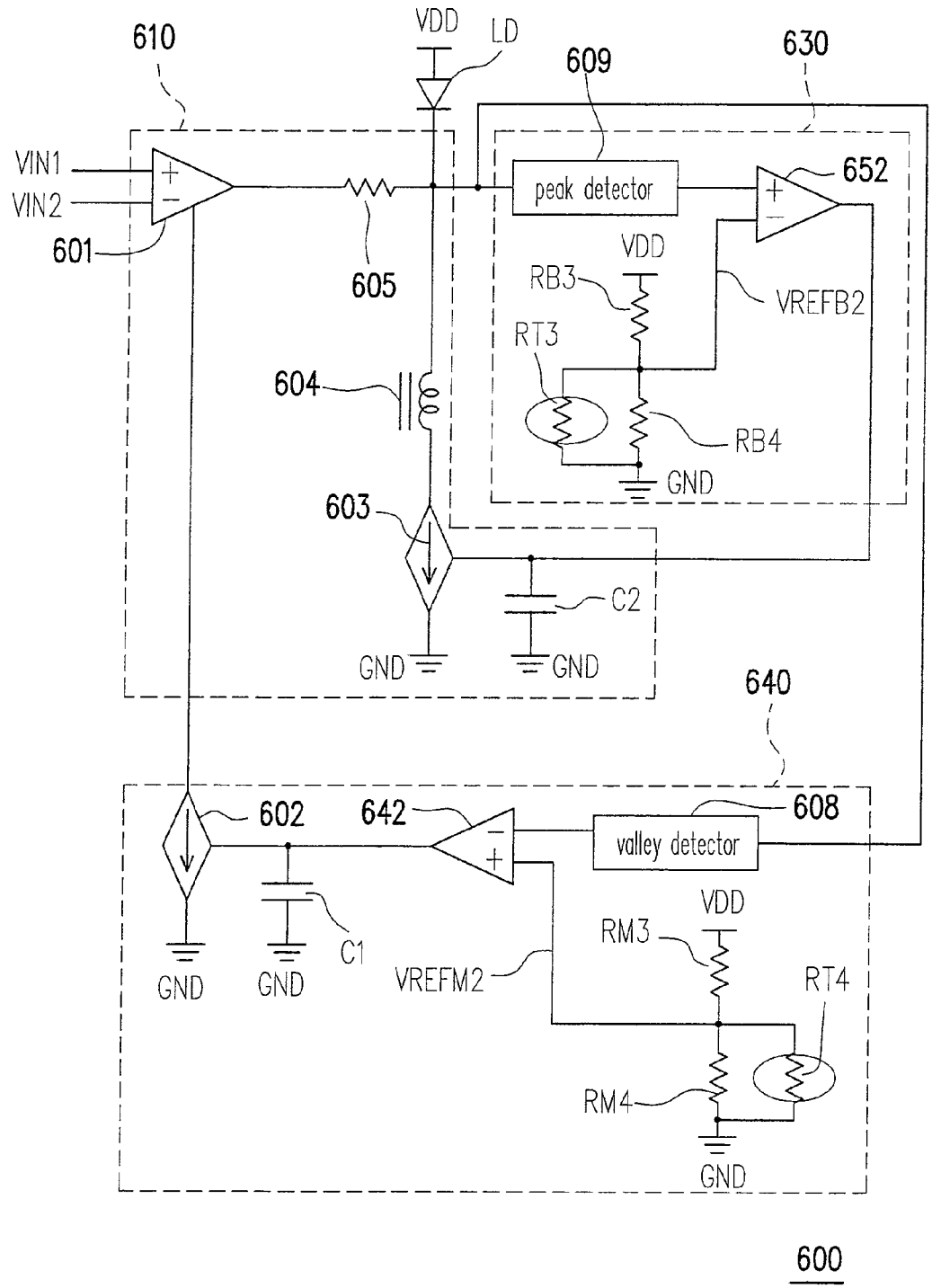
FIG. 6A shows an APC circuit according to a fourth embodiment of the present invention.

FIG. 6A shows a light transmitter according to a fourth embodiment of the present invention. The light transmitter 600 includes a light emitter and an APC circuit. The APC circuit further includes a driving module 610, a first feedback module 630, and a second feedback module 640, for driving a load. In this embodiment, the load (for example, the light emitter) of the APC circuit is a laser diode LD. In other embodiments, the light emitter may be other elements/circuits (for example, an LED). The driving module 610 provides a driving current to a cathode of the laser diode LD, and changes the driving current according to an input signal VIN. In this embodiment, the input signal VIN is a pair of differential signals VIN1 and VIN2.

An input end of the first feedback module 630 is coupled to the cathode of the laser diode LD, and an output end of the first feedback module 630 is coupled to the driving module 610. According to the driving current passing through the laser diode LD, the output end of the first feedback module 630 provides the bias signal to the driving module 610. Besides, the driving module 610 adjusts a mean value of the driving current according to a bias signal output by the first feedback module 630. The first feedback module 630 adjusts the bias signal according to a temperature.

An input end of the second feedback module 640 is also coupled to the cathode of the laser diode LD, and an output end of the second feedback module 640 is coupled to a bias control end of the driving module 610, so as to generate a modulation signal to control the driving module 610 to adjust the swing of the driving current. That is, according to the driving current passing through the laser diode LD, the output end of the second feedback module 640 provides a modulation signal to the driving module 610. Thus, the driving module 610 adjusts the swing of the driving current according to the modulation signal output by the second feedback module 640. The second feedback module 640 adjusts the modulation signal according to a temperature.

The driving module 610 further includes a driver 601, a resistor 605, a bypass capacitor C2, and a bias current source 603. An input end of the driver 601 receives a pair of differential signals VIN1 and VIN2, and an output end of the driver 601 is coupled to the cathode of the laser diode LD through the resistor 605. A current end of the bias current source 603 is coupled to the cathode of the laser diode LD through a ferrite bead 604, so as to provide a bias current to the laser diode LD. The ferrite bead 604 filters high frequency noises of the circuit, so as to prevent electromagnetic interference. The bypass capacitor C2 is coupled between a control end of the bias current source 603 and a ground line GND.

Referring to FIG. 6A again, the first feedback module 630 includes a peak detector 609, a comparator 652, a first resistor RB3, a second resistor RB4, and a first thermistor RT3. An input end of the peak detector 609 is coupled to the cathode of the laser diode LD, and a mean value of the driving current of the laser diode LD is calculated and output to a first input end (for example, a positive input end) of the comparator 652. A second input end (for example, a negative input end) of the comparator 652 receives a first reference voltage VREFB2, and the first reference voltage VREFB2 changes with the temperature. Moreover, an output end of the comparator 652 is coupled to a control end of the bias current source 603, for controlling the bias current source 603.

In this embodiment, the first reference voltage VREFB2 is generated by the first resistor RB3, the second resistor RB4, and the first thermistor RT3. A first end of the first resistor RB3 is coupled to a first voltage (for example, a system power supply VDD), and a second end of the first resistor RB3 provides the first reference voltage VREFB2. The second resistor RB4 is coupled between the second end of the first resistor RB3 and a second voltage (for example, a ground line GND). The first thermistor RT3 is coupled between the second end of the first resistor RB3 and the system ground line GND, i.e., connected in parallel with the second resistor RB4. The first reference voltage VREFB2 is generated by a voltage division circuit constituted by the first resistor RB3, the second resistor RB4, and the first thermistor RT3, and is obtained by the following mathematical expression (in the expression, RB4//RT3 is the resistance value of the second resistor RB4 and first thermistor RT3 connected in parallel):

$$VREFB2 = VDD - \frac{VDD \cdot RB3}{RB3 + RB4 // RT3}$$

The first feedback circuit 630 adjusts the bias current source 603 to make an output signal of the peak detector 609 close to the first reference voltage VREFB2, i.e., to make a peak value of the level at the cathode of the laser diode LD approximate to the first reference voltage VREFB2.

The second feedback module 640 further includes a valley detector 608, a comparator 642, a third resistor RM3, a fourth resistor RM4, a second thermistor RT4, a modulation current source 602, and a capacitor C1. An input end of the valley detector 608 is coupled to the cathode of the laser diode LD. The valley detector 608 detects a valley value of the driving current of the laser diode LD, and outputs the valley value of the driving current to a first input end (for example, a negative input end) of the comparator 642. A second input end (for example, a positive input end) of the comparator 642 is coupled to a second reference voltage VREFM2, and the second reference voltage VREFM2 changes with the temperature. An output end of the comparator 642 is coupled to a control end of the modulation current source 602. The bypass capacitor C1 is coupled between the control end of the modulation current source 602 and the ground line GND. A current end of the modulation current source 602 is coupled to the bias control end of the driving module 610, so as to generate the modulation signal to control the driving module 610 to adjust the swing of the driving current.

In this embodiment, the second reference voltage VREFM2 is generated by the third resistor RM3, the fourth resistor RM4, and the second thermistor RT4. A first end of the third resistor RM3 is coupled to a first voltage (here, a system power supply VDD), and a second end of the third resistor RM3 provides a second reference voltage VREFM2. The fourth resistor RM4 is coupled between a second end of the resistor RM3 and a second voltage (here, a ground line GND). The second thermistor RT4 is coupled between the second end of the third resistor RM3 and the system ground line GND, i.e., connected in parallel with the fourth resistor RM4. The second reference voltage VREFM2 is generated by a voltage division circuit constituted by the third resistor RM3, the fourth resistor RM4, and the second thermistor RT4, and is obtained by the following mathematical expression (in the expression, RM4//RT4 is the resistance value of the fourth resistor RM4 and second thermistor RT4 connected in parallel):

$$VREFM2 = VDD - \frac{VDD \cdot RM3}{RM3 + RM4 // RT4}$$

Similar to the first feedback circuit 630, the second feedback circuit 640 adjusts the modulation current source 602 to make an output signal of the valley detector 608 close to the second reference voltage VREFM2, i.e., to make a minimum value (i.e., a valley value of the driving current) of the level at the cathode of the laser diode LD approximate to the second reference voltage VREFM2.

Figure 6B:
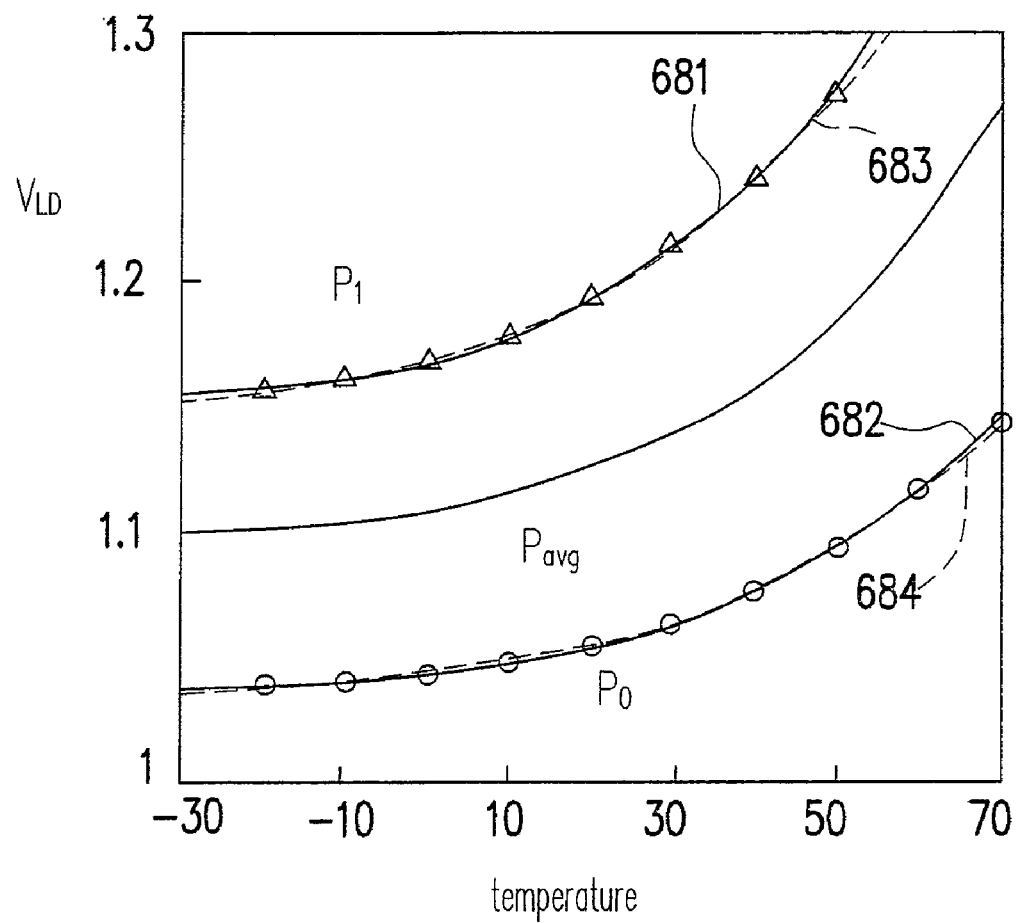
FIG. 6B is a characteristic curve diagram of a laser diode in FIG. 6A.

FIG. 6B is a curve diagram showing the relationship between the span voltage $V_{LD}$ of the laser diode LD in FIG. 6A and the temperature. Referring to FIGS. 6A and 6B together, the curve 681 (solid line) shows the relationship between the actual measured span voltage $V_{LD}$ of the laser diode LD and the temperature when a maximum power $P_1$ of about 0.5 mW is output to the laser diode LD. The curve 682 (solid line) shows the relationship between the actual measured span voltage $V_{LD}$ of the laser diode LD and the temperature when a minimum power $P_0$ of about 0.1 mW is output to the laser diode LD. Similar to the first embodiment, according to the characteristic of the thermistor, a formula between the first reference voltage VREFB2 and the resistors and a formula between the second reference voltage VREFM2 and the resistors are obtained, thereby obtaining a curve 683 (dashed line) and a curve 684 (dashed line). The curve 683 shows the relationship between the system power supply VDD minus the first reference voltage VREFB2 and the temperature. That is, in this embodiment, the curve 683 is a simulated curve showing the relationship between the span voltage $V_{LD}$ of the laser diode LD and the temperature when a maximum power $P_1$ of about 0.5 mW is output to the laser diode LD. Likewise, the curve 684 shows the relationship between the system power supply VDD minus the second reference voltage VREFM2 and the temperature. That is, in this embodiment, the curve 684 is a simulated curve showing the relationship between the span voltage $V_{LD}$ of the laser diode LD and the temperature when a minimum power $P_0$ of about 0.1 mW is output to the laser diode LD.

A resistor combination that makes the curve 681 match the curve 683 and the curve 682 match the curve 684 may be obtained by adjusting the resistance values of the first resistor RB3, the second resistor RB4, the third resistor RM3, and the fourth resistor RM4, or by selecting a different first thermistor RT3 and second thermistor RT4. The selected resistor combination may achieve the purpose of achieving a fixed output power of the laser in the embodiment so as to further stabilize the output power and extinction ratio.

Figure 7A:
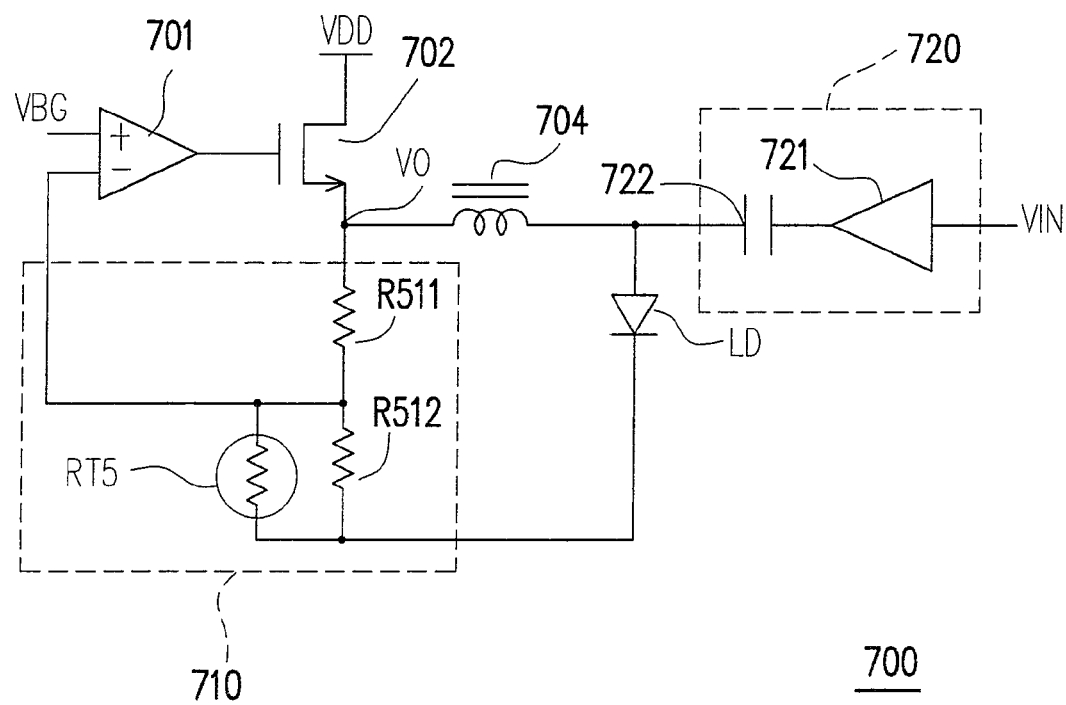
FIG. 7A shows an APC circuit according to a fifth embodiment of the present invention.

FIG. 7A shows a light transmitter according to a fifth embodiment of the present invention. The light transmitter 700 includes a light emitter and an APC circuit. In this embodiment, the load (for example, the light emitter) of the APC circuit is a laser diode LD. In other embodiments, the light emitter may be other elements/circuits (for example, an LED). In this embodiment, the APC circuit includes an amplifier 701, a transistor 702, a voltage buffer unit 720, a feedback module 710, and a ferrite bead 704. An input end of the voltage buffer unit 720 receives an input signal VIN, and an output end of the voltage buffer unit 720 provides an AC signal to an anode of the laser diode LD, for driving the laser diode LD. The voltage buffer unit 720 further includes a group of drivers 721 and a capacitor 722. In this embodiment, the drivers 721 are buffers. The input signal VIN is transmitted to a first end of the capacitor 722 through the drivers 721. The capacitor 722 is capable of filtering the DC component from the input signal VIN, such that the AC component of the input signal VIN passes through the capacitor 722 to reach the anode of the laser diode LD.

A first input end (for example, a positive input end) of the amplifier 701 receives a reference voltage (here, a bandgap voltage VBG), and a second input end (for example, a negative input end) of the amplifier 701 is coupled to the feedback module 710. A gate of the transistor 702 is coupled to an output end of the amplifier 701. A first source/drain of the transistor 702 is coupled to a first voltage (system power supply VDD), and a second source/drain of the transistor 702 is coupled to the output end of the voltage buffer unit 720 through the ferrite bead 704. The ferrite bead 704 filters high frequency noises of the circuit, so as to prevent electromagnetic interference.

As the first input end of the amplifier 701 is a bandgap voltage VBG, an output voltage not changing with the system power supply is generated. The output voltage is output to serve as a modulation voltage VO through an output buffer period (i.e., the transistor 702). The feedback module 710 includes a fifth resistor R511, a sixth resistor R512, and a third thermistor RT5. The fifth resistor R511 is coupled between the transistor 702 and the sixth resistor R512, and the other end of the sixth resistor R512 is coupled to the system ground line GND. The third thermistor RT5 is coupled to the amplifier 501, the fifth resistor R511, and the sixth resistor R512. Since the bandgap voltage VREF does not change with the system voltage, the bandgap voltage VREF may be regarded as a fixed value, and the modulation voltage VO may be obtained by the following formula (in the expression, R512//RT5 is the resistance value of the sixth resistor R512 and third thermistor RT5 connected in parallel):

$$VO = VBG \frac{R511 + R512 // RT5}{R512 // RT5}$$

It may be clearly seen from the above mathematical expression that, the resistance value of the thermistors may change with the temperature, thus changing the modulation voltage VO. Correspondingly, the variation of the modulation voltage VO may change the span voltage $V_{LD}$ of the laser diode LD, thereby further adjusting the characteristic curve of the laser diode LD.

Figure 7B:
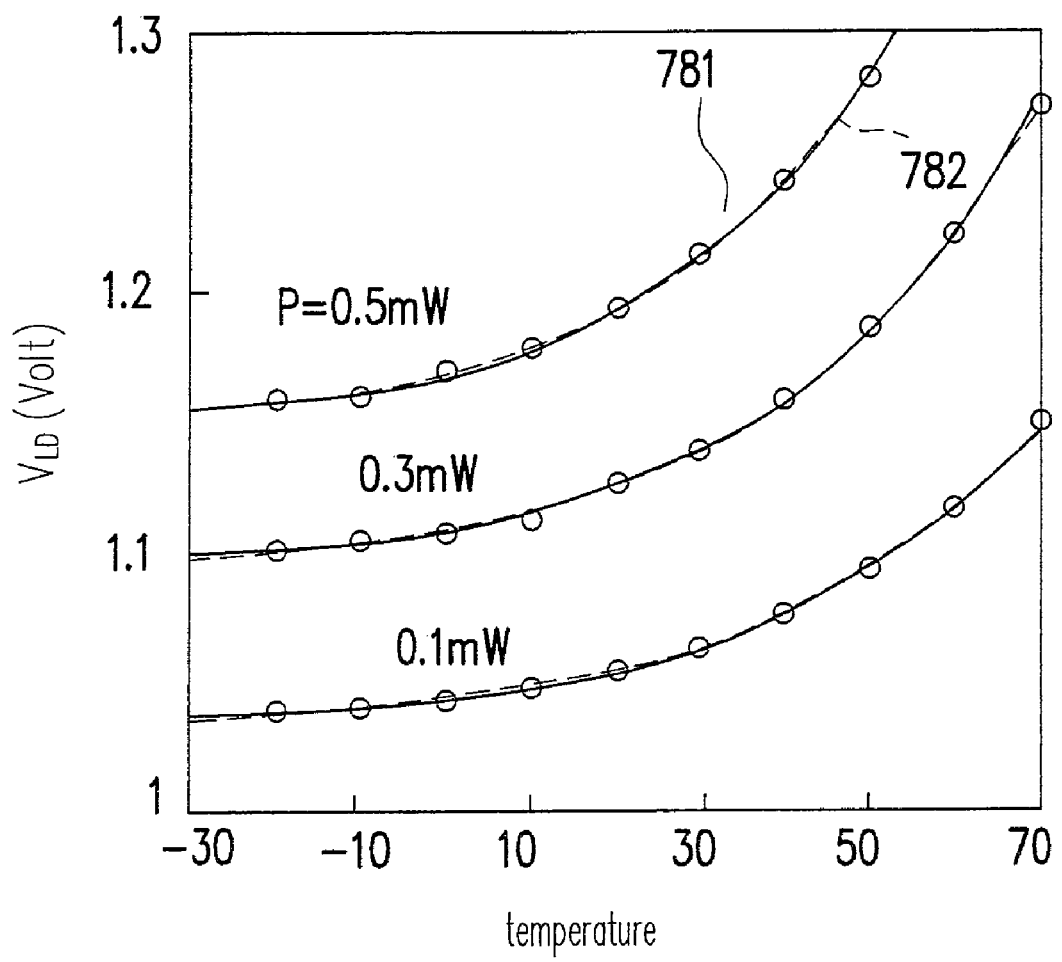
FIG. 7B is a characteristic curve diagram of a laser diode in FIG. 7A.

Referring to FIG. 7B, the curve 781 (solid line) is a curve showing the change of the span voltage $V_{LD}$ of the laser diode LD at an output power P (here, assuming that the maximum value of the power P of the laser diode LD is approximately 0.5 mW, the mean value is about 0.3 mW, and the minimum value is about 0.1 mW) caused by the rise of the temperature. According to the formula of the modulation voltage VO, a simulated curve 782 may be obtained by selecting appropriate resistors R511, R512 and thermistor RT5, and the curve 782 is in perfect match with the curve 781, thereby achieving the function of the present invention.

Figure 8A:
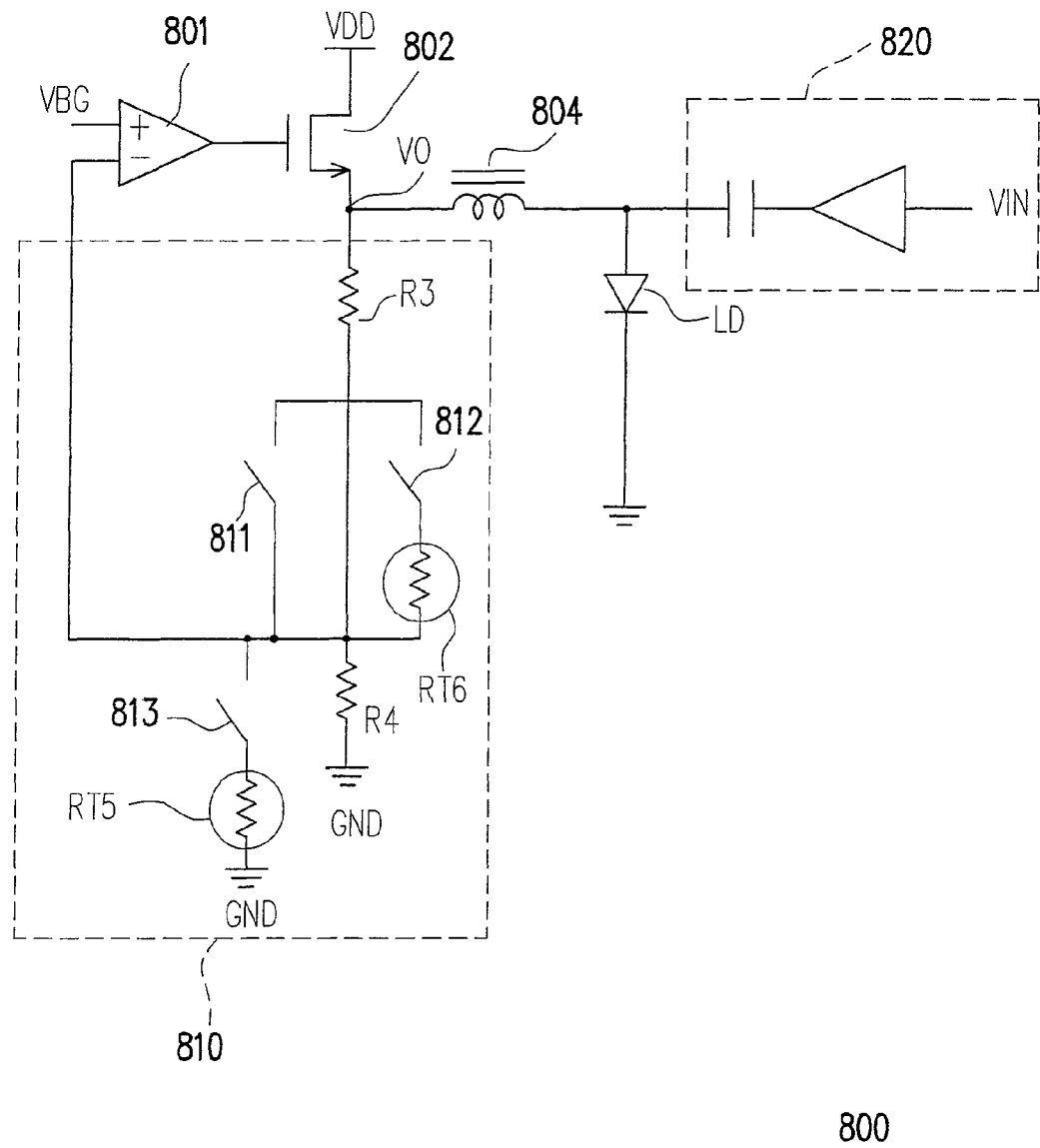
FIG. 8A shows an APC circuit according to a sixth embodiment of the present invention

FIG. 8A shows a light transmitter according to a sixth embodiment of the present invention. The light transmitter 800 includes a light emitter and an APC circuit. In this embodiment, the load (for example, the light emitter) of the APC circuit is a laser diode LD. In other embodiments, the light emitter may be other elements/circuits (for example, an LED). In this embodiment, the APC circuit includes an amplifier 801, a transistor 802, a voltage buffer unit 820, a feedback module 810, and a ferrite bead 804.

Figure 8B:
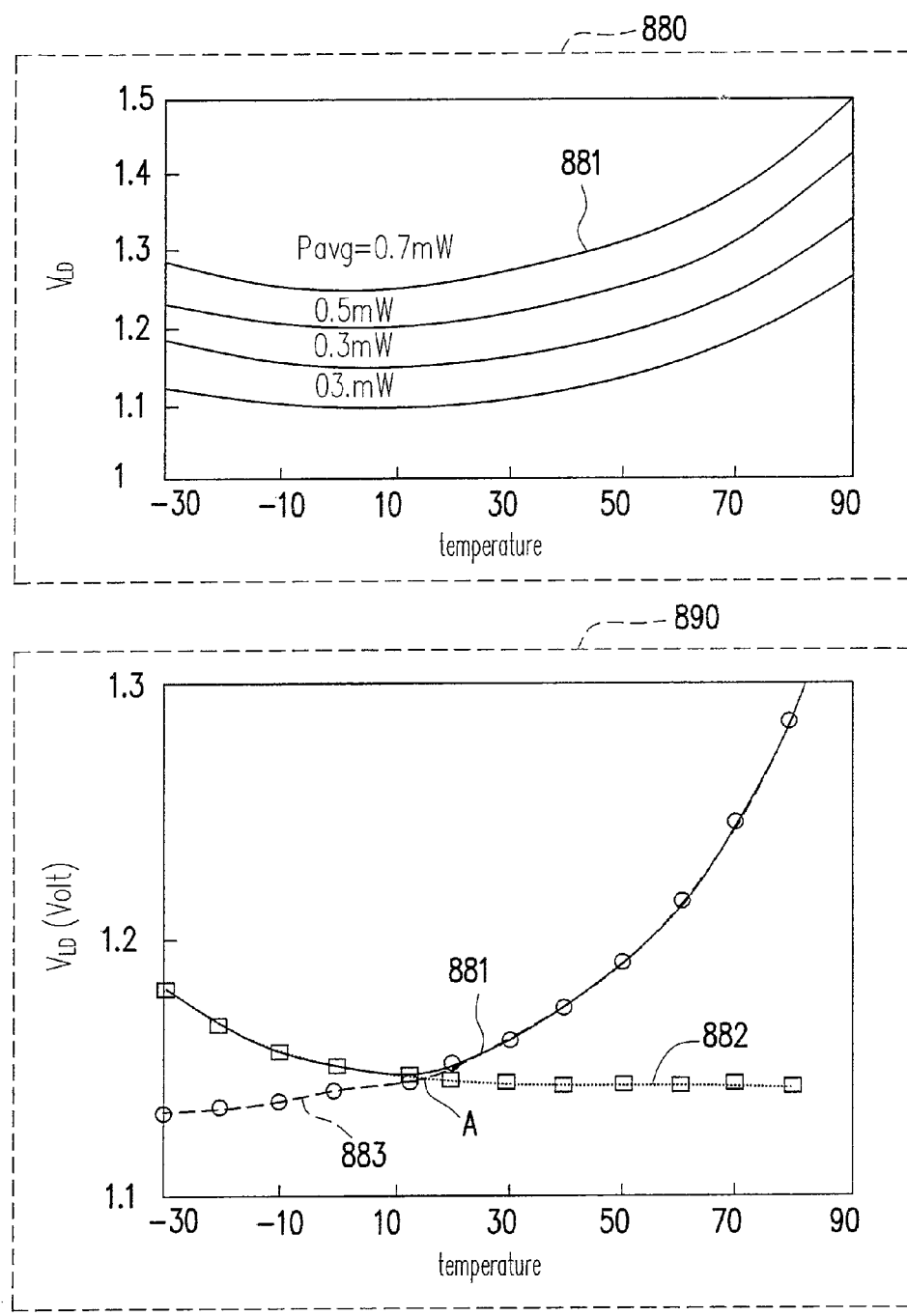
FIG. 8B is a characteristic curve diagram of a laser diode and a thermistor in FIG. 8A.

This embodiment is applicable to some particular types of laser diodes LD (i.e., laser diodes LD with a characteristic curve in a sub-FIG. 880 of FIG. 8B). The characteristic curve of such types of laser diodes LD is the parabolic curve instead of the multiplier curve.

The architecture of this embodiment is similar to that of the fifth embodiment, so the details of the same part will not be described herein again. The difference between the architectures of this and the fifth embodiment lies in the feedback module 810. The feedback module 810 includes a first switch 811, a second switch 813, a third switch 812, a sixth resistor R4, a fifth resistor R3, a third thermistor RT5, and a fourth thermistor RT6. A first end of the resistor R3 is coupled to a second source/drain of the transistor 802. A first end of the switch 811 is coupled to a second end of the resistor R3, and a second end of the switch 811 is coupled to the second input end (here, a negative input end) of the amplifier 801. The resistor R4 is coupled between the second end of the switch 811 and a second voltage (here, a ground line GND). A first end of the switch 813 is coupled to the second end of the switch 811. The thermistor RT5 is coupled between a second end of the switch 813 and the ground line GND. A first end of the switch 812 is coupled to a second end of the resistor R3. The thermistor RT6 is coupled between a second end of the switch 812 and a first end of the resistor R4. The switches 811, 812 are enabled in the same way, and the switches 813, 811 are enabled in opposite ways.

Referring to FIG. 8B, the sub-FIG. 880 is a characteristic curve diagram of a laser diode LD to be driven by the present invention. The sub-FIG. 890 shows the relationship between the span voltage $V_{LD}$ of the laser diode LD and the temperature of the circuits formed by the different turn-on/off states of the switches. The curve 881 shows the relationship between the span voltage $V_{LD}$ of the laser diode LD and the temperature at a certain mean output power $P_{AVG}$ (for example, 0.7 mW, 0.5 mW, 0.3 mW and/or 0.1 mW). When the third switch 812 is enabled, and the first switch 811 and the second switch 813 are disabled, the relationship between the output modulation voltage VO and the feedback module 810 is as follow:

$$VO = VBG \frac{R3 + R4 + RT6}{R4}$$

A curve 882 may be obtained according to the above formula and the characteristics of the thermistors. Comparatively, when the switch 812 is disabled, and the switches 811, 813 are enabled, the relationship between the modulation voltage VO and the feedback module 810 may be modified as follows:

$$VO = VBG \frac{R3 + R4 // RT5}{R4 // RT5}$$

A curve 883 may be obtained according to the above formula and the characteristics of the thermistors. In the figure, the junction A is an intersection point of the two curves.

From the two relation diagrams in FIG. 8B, it may be easily found that the curve 882 is close to the actual characteristic curve 881 before the junction A, and the curve 883 is close to the curve 881 after the junction A. Thus, the laser diode LD may be driven by the combination of the characteristics of the two curves.

Therefore, in this embodiment, the whole operation is divided into two periods. During the first period, the switches 811, 813 are disabled, and the switch 812 is enabled. During the second period, the switches 811, 813 are enabled, and the switch 812 is disabled. The first period is before the junction A at low temperature. Once the temperature rises with the operating time and exceeds the junction A, the second period starts. Then, if the temperature drops to below the junction A due to stand-by or sleep of the laser diode LD, the operation returns to the first period. In this manner, the operation is in perfect match with the characteristic curve of the laser diode LD, thereby stabilizing the output power and extinction ratio.

In view of the above, the aforementioned embodiments employ the negative temperature coefficient characteristic of the thermistors to feedback, control and adjust the laser diode LD, thereby obtaining the fixed output power and extinction ratio. Moreover, different from the conventional art, the above embodiments do not use photo diodes, so the difficulty in design and manufacturing is alleviated, and the production cost is effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An automatic power control (APC) circuit, comprising:
   a voltage buffer unit, with an input end for receiving an input signal, and an output end for providing an AC signal to a load;
   an amplifier, with a first input end for receiving a reference voltage;
   a transistor, with a gate coupled to an output end of the amplifier, a drain coupled to a first voltage, and a source coupled to the output end of the voltage buffer unit; and
   a feedback module, having an impedance, and coupled between the source of the transistor and a second input end of the amplifier, for providing a feedback signal to the amplifier.

2. The APC circuit according to claim 1, wherein the impedance of the feedback module changes with a temperature.

3. The APC circuit according to claim 2, wherein the temperature comprises an operating temperature of the load.

4. The APC circuit according to claim 1, wherein the voltage buffer unit comprises:
- a driver, with an input, end for receiving the input signal; and
- a capacitor, with a first end coupled to an output end of the driver, and an output end serving as the output end of the voltage buffer unit.

5. The APC circuit according to claim 1, wherein the reference voltage is a bandgap reference voltage.

6. The APC circuit according to claim 1, wherein the feedback module comprises:
- a first resistor, with a first end coupled to the source of the transistor, and a second end coupled to the second input end of the amplifier;
- a second resistor, with a first end coupled to the second end of the first resistor, and a second end coupled to a second voltage; and
- a first thermistor, with a first end coupled to the second end of the first resistor, and a second end coupled to the second voltage.

7. The APC circuit according to claim 1, wherein the feedback module comprises:
- a first resistor, with a first end coupled to the source of the transistor;
- a first switch, with a first end coupled to a second end of the first resistor, and a second end coupled to a second input end of the amplifier;
- a second resistor, with a first end coupled to the second end of the first switch, and a second end coupled to a second voltage;
- a second switch, with a first end coupled to the second end of the first switch;
- a first thermistor, with a first end coupled to the second end of the second switch, and a second end coupled to the second voltage;
- a third switch, with a first end coupled to the second end of the first resistor; and
- a second thermistor, with a first end coupled to a second end of the third switch, and a second end coupled to the first end of the second resistor.

8. The APC circuit according to claim 7, wherein the first and the second switch are enabled in the same way, and the third and the first switch are enabled in opposite ways.

9. The APC circuit according to claim 1, wherein the load comprises an LED.

10. The APC circuit according to claim 1, wherein the load comprises a laser diode.

11. A light transmitter, comprising:
- a light emitter;
- a voltage buffer unit, with an input end for receiving an input signal, and an output end for providing an AC signal to the light emitter;
- an amplifier, with a first input end for receiving a reference voltage;
- a transistor, with a gate coupled to an output end of the amplifier, a drain coupled to a first voltage, and a source coupled to the output end of the voltage buffer unit; and
- a feedback module, having an impedance, and coupled between the source of the transistor and a second input end of the amplifier, for providing a feedback signal to the amplifier.

12. The light transmitter according to claim 11, wherein the light emitter comprises a laser diode.

13. The light transmitter according to claim 11, further comprising a ferrite bead coupled between the output end of the voltage buffer unit and the source of the transistor, for filtering high frequency noises.

14. The light transmitter according to claim 11, wherein the impedance of the feedback module changes with a temperature.

15. The light transmitter according to claim 14, wherein the temperature comprises an operating temperature of the light emitter.

16. The light transmitter according to claim 11, wherein the voltage buffer unit comprises:
- a driver, with an input end for receiving the input signal; and
- a capacitor, with a first end coupled to an output end of the driver, and an output end serving as the output end of the voltage buffer unit.

17. The light transmitter according to claim 11, wherein the reference voltage is a bandgap reference voltage.

18. The light transmitter according to claim 11, wherein the feedback module comprises:
- a first resistor, with a first end coupled to the source of the transistor, and a second end coupled to the second input end of the amplifier;
- a second resistor, with a first end coupled to the second end of the first resistor, and a second end coupled to a second voltage; and
- a first thermistor, with a first end coupled to the second end of the first resistor, and a second end coupled to the second voltage.

19. The light transmitter according to claim 11, wherein the feedback module comprises:
- a first resistor, with a first end coupled to the source of the transistor;
- a first switch, with a first end coupled to a second end of the first resistor, and a second end coupled to a second input end of the amplifier;
- a second resistor, with a first end coupled to the second end of the first switch, and a second end coupled to a second voltage;
- a second switch, with a first end coupled to the second end of the first switch;
- a first thermistor, with a first end coupled to the second end of the second switch, and a second end coupled to the second voltage;
- a third switch, with a first end coupled to the second end of the first resistor; and
- a second thermistor, with a first end coupled to a second end of the third switch, and a second end coupled to the first end of the second resistor.

* * * * *